United States Patent
Vora et al.

(10) Patent No.: US 9,071,197 B2
(45) Date of Patent: Jun. 30, 2015

(54) HARMONIC REJECTIVE PASSIVE UP CONVERTER

(71) Applicant: QUALCOMM Incorporated, San Diego, CA (US)

(72) Inventors: Sameer Vasantlal Vora, San Diego, CA (US); Jeremy Darren Dunworth, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 14/040,066

(22) Filed: Sep. 27, 2013

(65) Prior Publication Data
US 2015/0094004 A1    Apr. 2, 2015

(51) Int. Cl.
H04B 1/04      (2006.01)
H03D 7/16      (2006.01)

(52) U.S. Cl.
CPC .................................... *H03D 7/165* (2013.01)

(58) Field of Classification Search
USPC ................................. 455/209, 112, 114.1, 118
See application file for complete search history.

(56) References Cited

U.S. PATENT DOCUMENTS

| | | | |
|---|---|---|---|
| 8,583,072 B1 * | 11/2013 | Ciubotaru et al. | 455/318 |
| 8,606,210 B2 * | 12/2013 | Ru et al. | 455/323 |
| 2006/0205370 A1 | 9/2006 | Hayashi et al. | |
| 2008/0194222 A1 * | 8/2008 | Liu et al. | 455/296 |
| 2008/0284487 A1 | 11/2008 | Pullela et al. | |
| 2009/0174459 A1 | 7/2009 | Cicalini | |
| 2009/0268849 A1 | 10/2009 | Mu et al. | |
| 2009/0280767 A1 | 11/2009 | Tillman | |
| 2010/0120377 A1 * | 5/2010 | He | 455/77 |
| 2011/0249770 A1 | 10/2011 | Bellaouar et al. | |
| 2012/0049926 A1 * | 3/2012 | Shimizu et al. | 327/355 |
| 2012/0105128 A1 | 5/2012 | Jeurissen et al. | |
| 2013/0059556 A1 | 3/2013 | Molnar et al. | |

FOREIGN PATENT DOCUMENTS

WO    WO-2008139390 A1    11/2008

OTHER PUBLICATIONS

International Search Report and Written Opinion—PCT/US2014/056763—ISA/EPO—Dec. 5, 2014.

* cited by examiner

*Primary Examiner* — Blane J Jackson

(57) ABSTRACT

Methods and apparatuses are presented for harmonic reject upconverting a baseband signal using at least one quadrature passive upconversion mixer. In some embodiments, an apparatus may include a first quadrature passive mixer configured to receive a first baseband input and a first LO input, and a second quadrature passive mixer configured to receive a second baseband input and a second LO input. A first output of said first passive mixer may be directly connected to a first output of said second passive mixer and together coupled to a first amplifier input. A second output of said first passive mixer may be directly connected to a second output of said second passive mixer and together coupled to a second amplifier input. The transmitter may be configured to output an upconverted signal with at least one rejected harmonic spurious mixing product based on the first and second amplifier inputs.

45 Claims, 13 Drawing Sheets

| subperiod beginning at | Mixer 240 (ON resistance = √2*(1+1/√2)) | | | Mixer 245 (ON resistance = 1+1/√2) | | | | Mixer 250 (ON resistance = √2*(1+1/√2)) | | | | Figure 2A Time varying resistance | | Fig. 2A voltages | | I channel Commutation Function = R₂/((R₁+R₂)*I_bb) | Q channel Commutation Function = R1/((R₁+R₂)*Q_bb) |
|---|---|---|---|---|---|---|---|---|---|---|---|---|---|---|---|---|---|
| | I25_a state | IB25_a state | Q25_a state | QB25_a state | I25 state | IB25 state | Q25 state | QB25 state | I25_d state | IB25_d state | Q25_d state | QB25_d state | R₁ | R₂ | Vi | Vq | | |
| 0° | 1 | 0 | 0 | 0 | 1 | 0 | 0 | 0 | 0 | 0 | 0 | 1 | 1 | √2 + 1 | I_bb | -Q_bb | (√2 + 1)/(√2 + 2) | -1/(√2 + 2) |
| 45° | 0 | 0 | 1 | 0 | 1 | 0 | 0 | 0 | 0 | 0 | 0 | 0 | 1 | √2 + 1 | I_bb | Q_bb | (√2 + 1)/(√2 + 2) | 1/(√2 + 2) |
| 90° | 0 | 0 | 1 | 0 | 0 | 0 | 1 | 0 | 0 | 0 | 0 | 0 | √2 + 1 | 1 | I_bb | Q_bb | 1/(√2 + 2) | (√2 + 1)/(√2 + 2) |
| 135° | 0 | 1 | 0 | 0 | 0 | 0 | 1 | 0 | 0 | 0 | 0 | 0 | √2 + 1 | 1 | -I_bb | Q_bb | -1/(√2 + 2) | (√2 + 1)/(√2 + 2) |
| 180° | 0 | 1 | 0 | 0 | 0 | 1 | 0 | 0 | 0 | 0 | 0 | 0 | 1 | √2 + 1 | -I_bb | Q_bb | -(√2 + 1)/(√2 + 2) | 1/(√2 + 2) |
| 225° | 0 | 0 | 0 | 1 | 0 | 1 | 0 | 0 | 0 | 1 | 0 | 0 | 1 | √2 + 1 | -I_bb | -Q_bb | -(√2 + 1)/(√2 + 2) | -1/(√2 + 2) |
| 270° | 0 | 0 | 0 | 1 | 0 | 0 | 0 | 1 | 0 | 0 | 1 | 0 | (√2 + 1) | 1 | -I_bb | -Q_bb | -1/(√2 + 2) | -(√2 + 1)/(√2 + 2) |
| 315° | 1 | 0 | 0 | 0 | 0 | 0 | 0 | 1 | 0 | 0 | 0 | 1 | (√2 + 1) | 1 | I_bb | -Q_bb | 1/(√2 + 2) | -(√2 + 1)/(√2 + 2) |

| subperiod beginning at | 50% DTC LO Mixer (SW res = √2*(1+1/√2)) | | | | 25% DTC LO Mixer (SW res = 1+1/√2) | | | | Figure 2A Time | | Fig. 2A voltages | | I channel Commutation Function = R₂/((R₁+R₂)*I_bb) | Q channel Commutation Function = R1/((R₁+R₂)*Q_bb) |
|---|---|---|---|---|---|---|---|---|---|---|---|---|---|---|
| | I50 state | IB50 state | Q50 state | QB50 state | I25 state | IB25 state | Q25 state | QB25 state | R1 | R2 | Vi | Vq | | |
| 0° | 1 | 0 | 0 | 1 | 1 | 0 | 0 | 0 | √2+1 | -1 | I_bb | -Q_bb | (√2 + 1)/(√2 + 2) | -1/(√2 + 2) |
| 45° | 1 | 0 | 1 | 0 | 1 | 0 | 0 | 0 | √2+1 | 1 | I_bb | Q_bb | (√2 + 1)/(√2 + 2) | 1/(√2 + 2) |
| 90° | 0 | 0 | 1 | 0 | 0 | 0 | 1 | 0 | 1 | √2+1 | I_bb | Q_bb | 1/(√2 + 2) | (√2 + 1)/(√2 + 2) |
| 135° | 0 | 1 | 1 | 0 | 0 | 0 | 1 | 0 | -1 | √2+1 | -I_bb | Q_bb | -1/(√2 + 2) | (√2 + 1)/(√2 + 2) |
| 180° | 0 | 1 | 0 | 1 | 0 | 1 | 0 | 0 | -(√2+1) | 1 | -I_bb | Q_bb | -(√2 + 1)/(√2 + 2) | 1/(√2 + 2) |
| 225° | 0 | 1 | 0 | 1 | 0 | 1 | 0 | 0 | -(√2+1) | -1 | -I_bb | -Q_bb | -(√2 + 1)/(√2 + 2) | -1/(√2 + 2) |
| 270° | 0 | 0 | 0 | 1 | 0 | 0 | 0 | 1 | -1 | -(√2+1) | -I_bb | -Q_bb | -1/(√2 + 2) | -(√2 + 1)/(√2 + 2) |
| 315° | 1 | 0 | 0 | 0 | 0 | 0 | 0 | 1 | 1 | -(√2+1) | I_bb | -Q_bb | 1/(√2 + 2) | -(√2 + 1)/(√2 + 2) |

| subperiod beginning at | SW res = 1 | | | | SW res = 1 | | | | Ich Gain (α R₂) | Qch Gain (α R₁) |
|---|---|---|---|---|---|---|---|---|---|---|
| | I66 state | IB66 state | Q66 state | QB66 state | I33 state | IB33 state | Q33 state | QB33 state | | |
| 0° | 1 | 0 | 0 | -1 | 1 | 0 | 0 | 1 | 1 | -1 |
| 30° | 1 | 0 | 1 | -1 | 1 | 0 | 0 | 0 | 1 | 0 |
| 60° | 1 | 0 | 1 | -1 | 1 | 0 | 0 | 0 | 1 | 0 |
| 90° | 1 | 0 | 1 | 0 | 0 | 0 | 1 | 0 | 1 | 1 |
| 120° | -1 | 1 | 1 | 0 | 0 | 0 | 1 | 0 | 0 | 1 |
| 150° | -1 | 1 | 1 | 0 | 0 | 1 | 1 | 0 | 0 | 1 |
| 180° | 0 | 1 | 1 | -1 | 0 | 1 | 0 | 0 | -1 | 1 |
| 210° | 0 | 1 | 0 | -1 | 0 | 1 | 0 | 0 | -1 | 0 |
| 240° | 0 | 1 | 0 | -1 | 0 | 0 | 0 | 0 | -1 | 0 |
| 270° | -1 | 1 | 0 | -1 | 0 | 0 | 0 | 1 | -1 | -1 |
| 300° | -1 | 0 | 0 | -1 | 0 | 0 | 0 | 1 | 0 | -1 |
| 330° | -1 | 0 | 0 | -1 | 0 | 0 | 0 | 1 | 0 | -1 |

| subperiod beginning at | SW res = 1 ||||| I33 state | SW res = 1 |||| I33_d state | SW res = 1 |||| Ich Gain ($\alpha R_2$) | Qch Gain ($\alpha R_1$) |
| --- | --- | --- | --- | --- | --- | --- | --- | --- | --- | --- | --- | --- | --- | --- | --- | --- | --- |
| | I33_a state | IB33_a state | Q33_a state | QB33_a state | | | IB33 state | Q33 state | QB33 state | | | IB33_d state | Q33_d state | QB33_d state | | |
| 0° | 1 | 0 | 0 | 0 | 1 | 0 | 0 | 0 | 1 | 0 | 0 | 0 | 0 | -1 | 1 | -1 |
| 30° | 0 | 0 | 0 | 0 | 1 | 0 | 0 | 0 | 0 | 0 | 0 | 0 | 0 | -1 | 1 | 0 |
| 60° | 0 | 0 | 1 | 0 | 1 | 0 | 0 | 0 | 0 | -1 | 0 | 0 | 0 | -1 | 1 | 0 |
| 90° | 0 | 1 | 1 | 0 | 0 | 0 | 0 | 0 | 0 | -1 | 0 | 0 | 0 | 0 | 1 | -1 |
| 120° | 0 | 1 | 1 | 0 | 0 | 0 | 0 | 1 | 0 | -1 | 0 | 0 | 0 | 0 | 0 | -1 |
| 150° | 0 | 1 | 0 | 0 | 0 | 0 | 0 | 1 | 0 | 0 | 0 | 0 | -1 | 0 | 0 | -1 |
| 180° | 0 | 0 | 0 | -1 | 0 | 0 | 0 | 0 | 0 | 0 | -1 | 0 | -1 | 0 | -1 | 0 |
| 210° | 0 | 0 | 0 | -1 | 0 | 0 | 0 | 0 | 0 | 0 | -1 | 0 | -1 | 0 | -1 | 0 |
| 240° | 0 | 0 | 0 | -1 | 0 | 0 | 0 | 0 | -1 | 0 | -1 | 0 | 0 | 0 | -1 | -1 |
| 270° | 0 | 0 | 0 | 0 | 0 | 0 | 0 | 0 | -1 | 0 | 0 | 0 | 0 | 0 | 0 | -1 |
| 300° | 1 | 0 | 0 | 0 | 0 | 0 | 0 | 0 | -1 | 0 | 0 | 0 | 0 | 0 | 0 | -1 |
| 330° | 1 | 0 | 0 | 0 | 0 | 0 | 0 | 0 | 0 | 0 | 0 | 0 | 0 | -1 | 0 | -1 |

HARMONIC REJECTIVE PASSIVE UP CONVERTER

BACKGROUND

A typical transmitter has at least one up-converting mixer that frequency translates a baseband (BB) or an intermediate frequency (IF) signal to a radio frequency (RF) signal using a local oscillator (LO) signal. The mixer may be either an active gilbert cell type mixer or a passive voltage mode mixer. The process of amplifying, up-converting to the RF signal and amplifying again generates spurious signal emissions, such as the 4fmod (also called Counter IM3) nonlinearity, which are undesirable and should be eliminated or at least kept below a certain threshold to meet emission requirements. Harmonic reject up-converters using active mixers are known to mitigate some of these up-conversion products. As emission requirements become more stringent and precise, it is desirable to utilize harmonic rejective up converters using passive mixer designs. However, newer types of passive mixers used as upconverters, such as voltage switching passive mixers for example, cannot utilize effectively the older active mixer based harmonic reject up-converting solutions to mitigate the undesired mixer upconversion products.

SUMMARY

Apparatuses and methods are presented for using multiple direct quadrature voltage modulators with scaled switch resistances and multiphase LO signals to generate upconverted signals with rejected spurious harmonic mixing products.

In some embodiments, an apparatus is present for harmonic reject upconverting a baseband signal using at least one quadrature passive mixer. The apparatus may include a first quadrature passive mixer configured to receive quadrature baseband signals as a first baseband input and a first set of multi-phase LO signals as a first LO input. The apparatus may also include a second quadrature passive mixer configured to receive said quadrature baseband signals as a second baseband input and a second set of multi-phase LO signals as a second LO input. The first and second quadrature passive mixers each may include first and second outputs. The first output of said first quadrature passive mixer may be directly connected to said first output of said second quadrature passive mixer and together coupled to a first amplifier input. The second output of said first quadrature passive mixer may be directly connected to said second output of said second quadrature passive mixer and together coupled to a second amplifier input. The amplifier may also include an output, wherein said amplifier output is coupled to a transmitter output, and said transmitter output may be configured to output an upconverted signal with at least one rejected spurious harmonic mixing product based at least in part on the first and second amplifier inputs.

In some embodiments, the first set of multi-phase LO signals includes a first set of four-phase LO signals, and the second set of multi-phase LO signals includes a second set of four-phase LO signals. In some embodiments, the first set of four-phase LO signals are 25% duty cycle and the second set of four-phase LO signals are 50% duty cycle. In some embodiments, the first set of four-phase LO signals are shifted by 45 degrees relative to the second set of four-phase LO signals. In some embodiments, both the first and second passive mixer includes at least four transistors, each transistor having a series resistor. In some embodiments both the first and second passive mixer include at least eight transistors, the eight transistors connected in a double balanced fashion and each pair of transistors in the double balanced mixer having a series resistor. In some embodiments, the series resistors are scaled by a relative factor of 1 for the first passive mixer and by a relative factor of sqrt(2) for the second passive mixer. In some embodiments, the mixer transistor on resistance associated with both of the passive mixers is scaled by a same ratio as the resistors associated with both of the passive mixers.

In some embodiments, the apparatus may further include a third quadrature passive mixer, wherein each of the first, second, and third passive mixers receive 25% duty cycle LO signals. In some embodiments, the first set of four-phase LO signals are shifted by 45 degrees relative to the second set of four-phase LO signals and the first set of four-phase LO signals are shifted −45 degrees relative to the third set of four-phase LO signals. In some embodiments, the first, second, and third passive mixer comprises at least four transistors, each transistor having a series resistor. In some embodiments both the first and second passive mixer includes at least eight transistors, the eight transistors connected in a double balanced fashion and each pair of transistors in the double balanced mixer having a series resistor. In some embodiments, the series resistors are scaled by a relative factor of 1 for the first passive mixer, by a relative factor of sqrt(2) for the second passive mixer, and by a relative factor of sqrt(2) for the third passive mixer. In some embodiments, the mixer transistor on resistance is scaled by the same ratio as the resistors associated with the mixer transistors.

In some embodiments, the first quadrature passive mixer is directly connected to the first output of the second quadrature passive mixer based on principles of voltage division and voltage superposition.

In some embodiments, the first set of multi-phase LO signals includes a first set of four-phase LO signals, and the second set of multi-phase LO signals includes a second set of four-phase LO signals. In some embodiments, the first set of four-phase LO signals are 33.3% duty cycle and the second set of four-phase LO signals are 66.6% duty cycle. In some embodiments, the apparatus may further include a third quadrature passive mixer, wherein each of the first, second, and third passive mixers receive 33.3% duty cycle LO signals. In some embodiments, the said first set of four-phase LO signals are shifted by 60 degrees relative to the second set of four-phase LO signals and the first set of four-phase LO signals are shifted −60 degrees relative to the third set of four-phase LO signals.

In some embodiments, a method is presented for harmonic reject upconverting a baseband signal using at least one quadrature passive mixer. The method may include receiving quadrature baseband signals as a first baseband input and a first set of multi-phase LO signals as a first LO input, and receiving said quadrature baseband signals as a second baseband input and a second set of multi-phase LO signals as a second LO input. The method may also include generating a first upconverted output and its inverse upconverted output, both using the first baseband input and the first LO input, and generating a second upconverted output and its inverse upconverted output, both using the second baseband input and the second LO input. The method may also include directly connecting the first upconverted output to the second upconverted output and applying said result to a first amplifier input, and directly connecting the first inverse upconverted output to the second inverse upconverted output and applying said result to a second amplifier input. The method may also include transmitting an upconverted signal with at least one rejected spurious harmonic mixing product based at least in part on the first and second amplifier inputs.

In some embodiments, an apparatus is presented for harmonic reject upconverting a baseband signal. The apparatus may include means for receiving quadrature baseband signals as a first baseband input and a first set of multi-phase LO signals as a first LO input, means for receiving said quadrature baseband signals as a second baseband input and a second set of multi-phase LO signals as a second LO input, means for generating a first upconverted output signal and its inverse upconverted output, both using the first baseband input and the first LO input, means for generating a second upconverted output and its inverse upconverted output, both using the second baseband input and the second LO input, means for directly connecting the first upconverted output to the second upconverted output and applying said result to a first amplifier input, means for directly connecting the first inverse upconverted output to the second inverse upconverted output and applying said result to a second amplifier input, and means for transmitting an upconverted signal with at least one rejected spurious harmonic mixing product based at least in part on the first and second amplifier inputs.

BRIEF DESCRIPTION OF THE DRAWINGS

FIGS. 2A, 2B, and 2C illustrate an implementation of summation using the principle of voltage division.

FIGS. 3A and 3B illustrate an alternative implementation of a passive harmonic reject up-converter.

FIGS. 4A, 4B, 4C, 4D, 4E, and 4F illustrate additional alternative implementations of passive harmonic reject up-converters.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosures.

In a transmitter, it is desirable to reduce or eliminate spurious up-converting products, such as the 4fmod or counter-IM3 emissions that fall outside of the transmit band. At the same time, it is desirable to achieve such harmonic reject up-converting using minimal power consumption and/or employing efficient use of space. Harmonic rejection may be known in active mixers and also in passive mixers in receivers. However, as transceiver design moves to 45 nm and below process nodes, power efficient passive mixers become an attractive design option for the upconverter to improve the noise generated by the transmitter or transceiver in the corresponding receivers spectrum, also known as receive band noise (RxBN). The spurious upconversion products from these upconverters that give rise to generation of 4fmod (also called counter-IM3) in the nonlinear amplifiers that follow the upconverter, still need to be suppressed. Harmonic reject up-conversion in passive mixers is thus desirable as circuit designs become more miniaturized and precise and desire to meet improved performance with reduced power consumption. However, achieving such has proven to be a challenge in the industry.

Embodiments of the present invention mitigate these spurious mixing products in passive mixers, such as voltage switching passive mixers. In some embodiments, harmonic reject up-conversion in passive mixers is also power efficient, e.g. 25% duty cycle or 33% duty cycle. In some embodiments, a minimal number of filters are used, thereby also reducing cost, power and physical area of the transmitter circuits.

Figure 1:
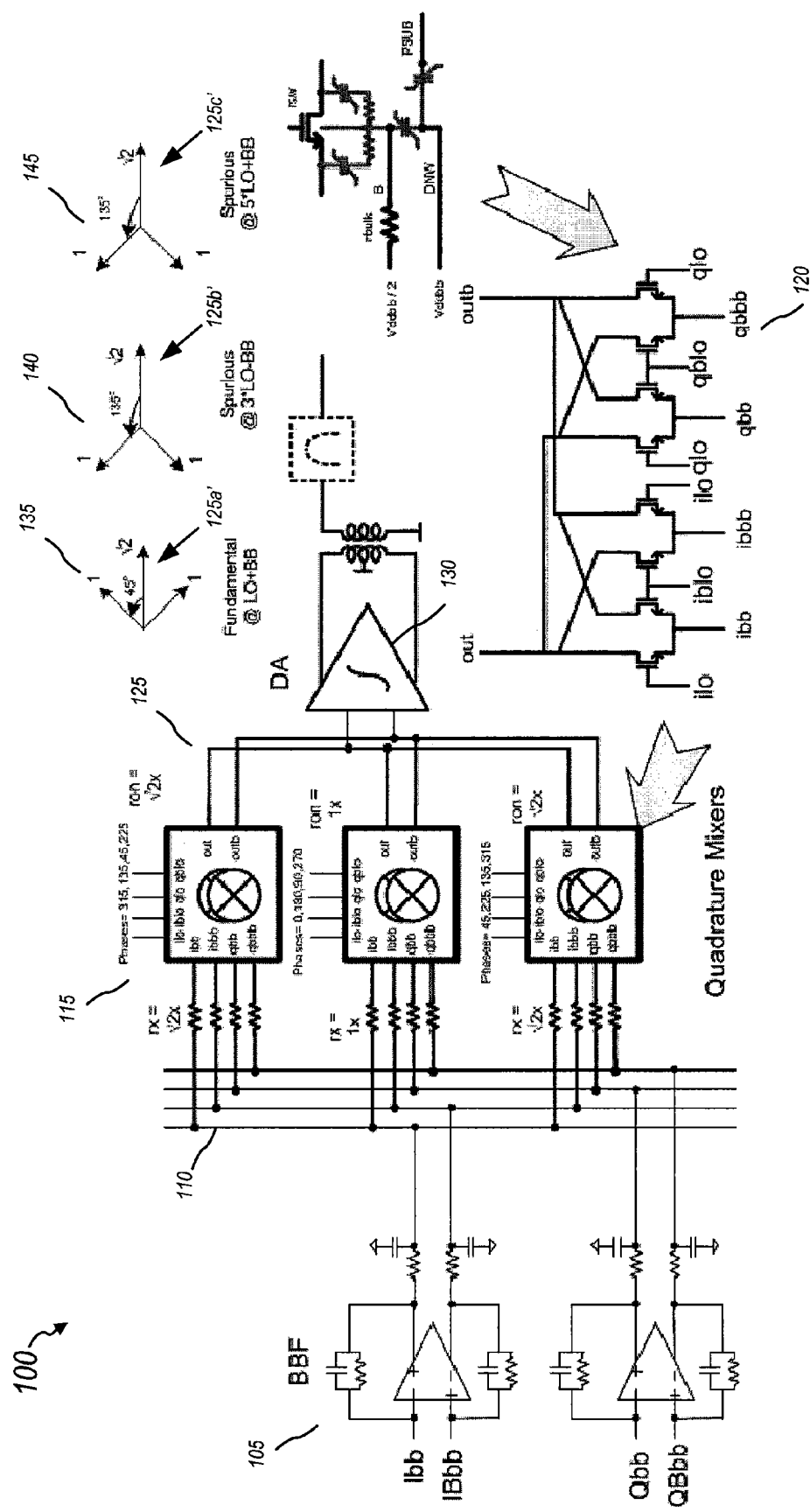
FIG. 1 is a schematic illustrating a passive harmonic reject up-converter according to an embodiment.

FIG. 1 shows a schematic illustrating a passive harmonic reject up-converter 100 according to an embodiment. In this example, four input baseband signals 105, i.e. Ibb, IBbb, Qbb, and QBbb, are passed through baseband filter (BBF) 106 and each are fed into three direct quadrature mixers 115. Each of the baseband inputs is scaled by a resistance 110. In some embodiments, this resistance, while being small, should be large relative to the on resistance of the mixer transistors. The on resistance of the mixer transistors is the drain to source resistance of the transistor when it is biased in the triode region. Each of the three direct quadrature mixers 115 are driven with different phases of the local oscillator (LO), with the mixers having relative phase shifts of −45, 0 and +45 degrees, respectively. In this case, the LO signals are 25% duty cycle. For the quadrature mixer phase shifted by −45 degrees, the input baseband signals 105 are fed through a scaled resistance 110 factor of sqrt(2). For the quadrature mixer phase shifted by 0 degrees, the input baseband signals 105 are fed through a scaled resistance 110 factor of 1. For the quadrature mixer phase shifted by +45 degrees, the input baseband signals 105 are fed through a scaled resistance 110 factor of sqrt(2). Similarly, the on resistance of the transistor switches forming the direct quadrature mixers 115 has been scaled by the same factors as the resistances 110 connecting to them. The transistor on resistances can be scaled by scaling the width to length ratio (W/L) of the transistors forming the mixers. Transistors that need to have a lower on resistance will have a correspondingly larger W/L ratio. All three mixer outputs 125 of the direct quadrature mixers 115 are directly connected together into a single driver amplifier (DA) or power amplifier (PA) 130. The careful selection of these scaling resistances 110, coupled with the particular selection of the LO phases going into each direct quadrature mixer 115 at the specified duty cycle, allow the fundamental signal (LO+BB or LO−BB) 135 to be generated, while the spurious mixing products near the third and fifth harmonic signals (3*LO−BB or 3*LO+BB, "third harmonic spurious mixing product") 140 and (5*LO+BB or 5*LO−BB, "fifth harmonic spurious mixing product") 145 are cancelled or suppressed. Outputs 125a, 125b, and 125c, correspond to vectors 125a', 125b', and 125c', respectively, in each of graphs 135, 140, and 145 to show how the outputs 125a, 125b, and 125c combine to generate the fundamental signal and cancel or suppress the third and fifth harmonic signals. As can be seen in graphs 135, 140 and 145 the upconverted signals contributed by outputs 125a' and 125c' when vector summed together add to the fundamental at LO+BB but cancel the $3^{rd}$ and $5^{th}$ harmonic spurious at 3*LO−BB and 5*LO+BB. Minimizing these spurious harmonic signals ultimately minimizes unwanted mixing products like 4FMOD.

Unlike typical mixers in the industry, the mixers presented herein are passive mixers. And unlike typical implementations in the industry, the outputs of the direct quadrature mixers 115 do not need to pass through any filters before being fed as inputs into DA 130, i.e. the mixer outputs can be directly connected to the DA 130. Not needing these filters may be advantageous for several reasons, including reducing cost and space in circuit designs utilizing the present embodiments. In some embodiments, mixer outputs 125 could be connected to a balun to convert differential mixer outputs to a single ended input for DA or PA 130. In these embodiments, balun design can focus on a broad tuning balun since reduced filtering is needed due to harmonic rejection of the upconversion mixers. In some embodiments, if additional suppression of $3^{rd}$ and $5^{th}$ harmonic signals is desired, relaxed filtering can be inserted between the outputs of the direct quadrature mixers 115 and the inputs into DA 130.

In some embodiments, a passive mixer can have the structure 120 as shown. Here, eight transistors are used to perform double balanced quadrature up-conversion. The terminal connections of this transistor structure can be the same as used for active mixers, however, passive mixers have no DC current flow through them, and thus when the individual mixer transistors are enabled by the LO signal, the drain to source voltage of the passive mixer transistor is ideally zero or at least less than the gate to source voltage of the passive mixer transistor minus the transistor threshold voltage, also known as the overdrive voltage. In the double balanced mixer of structure 120, each of the four baseband input signals is connected to a pair of transistors corresponding to a pair of LO phases that are used for upconverting the individual baseband input signals to RF.

In some embodiments, the transistors inside the direct quadrature mixers 115 can be implemented as NMOS/PMOS complementary transistor pairs. In some embodiments, at lower powers, when harmonic rejection is not needed, the two mixers with +45 and −45 phase shifted LO and their associated LO buffers may be disabled to achieve lower power output and/or to save circuit power.

Figure 2A:
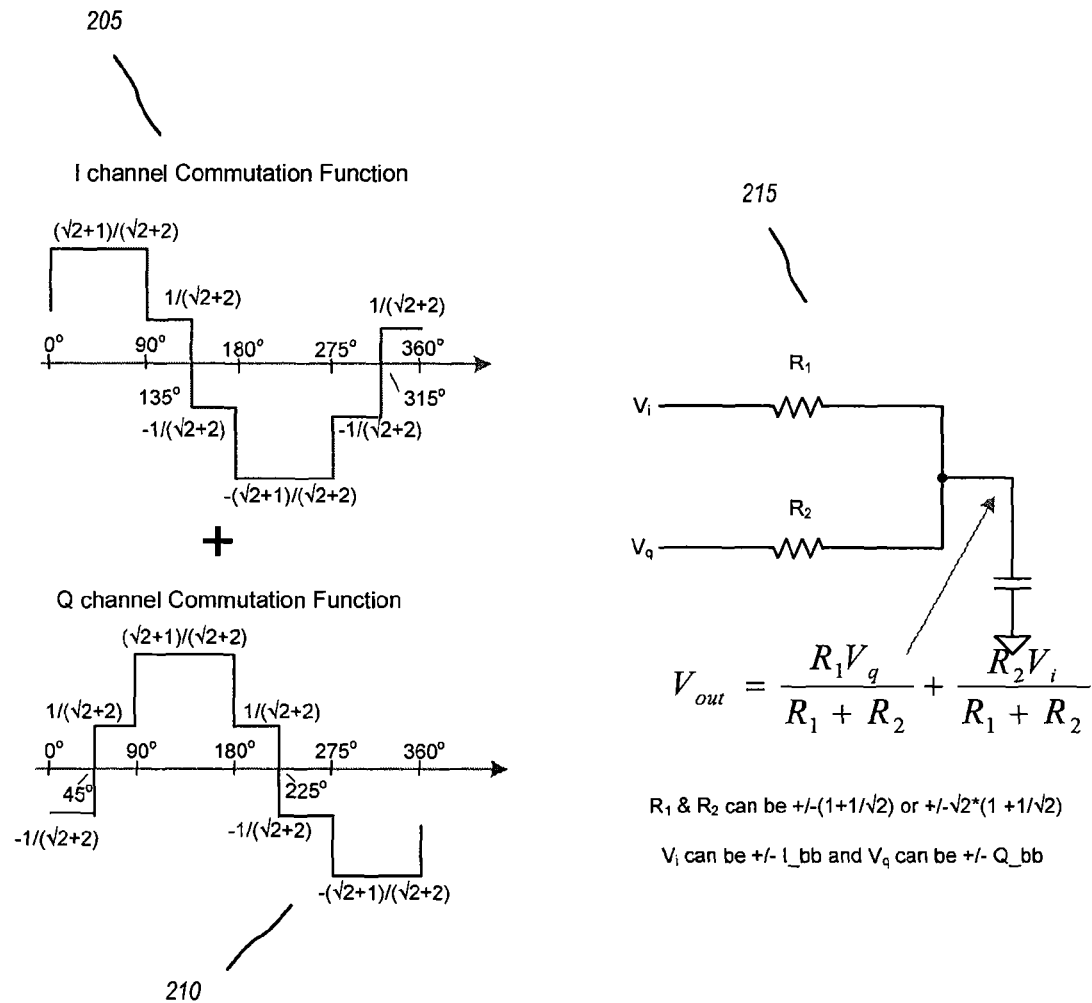
Figure 2B:
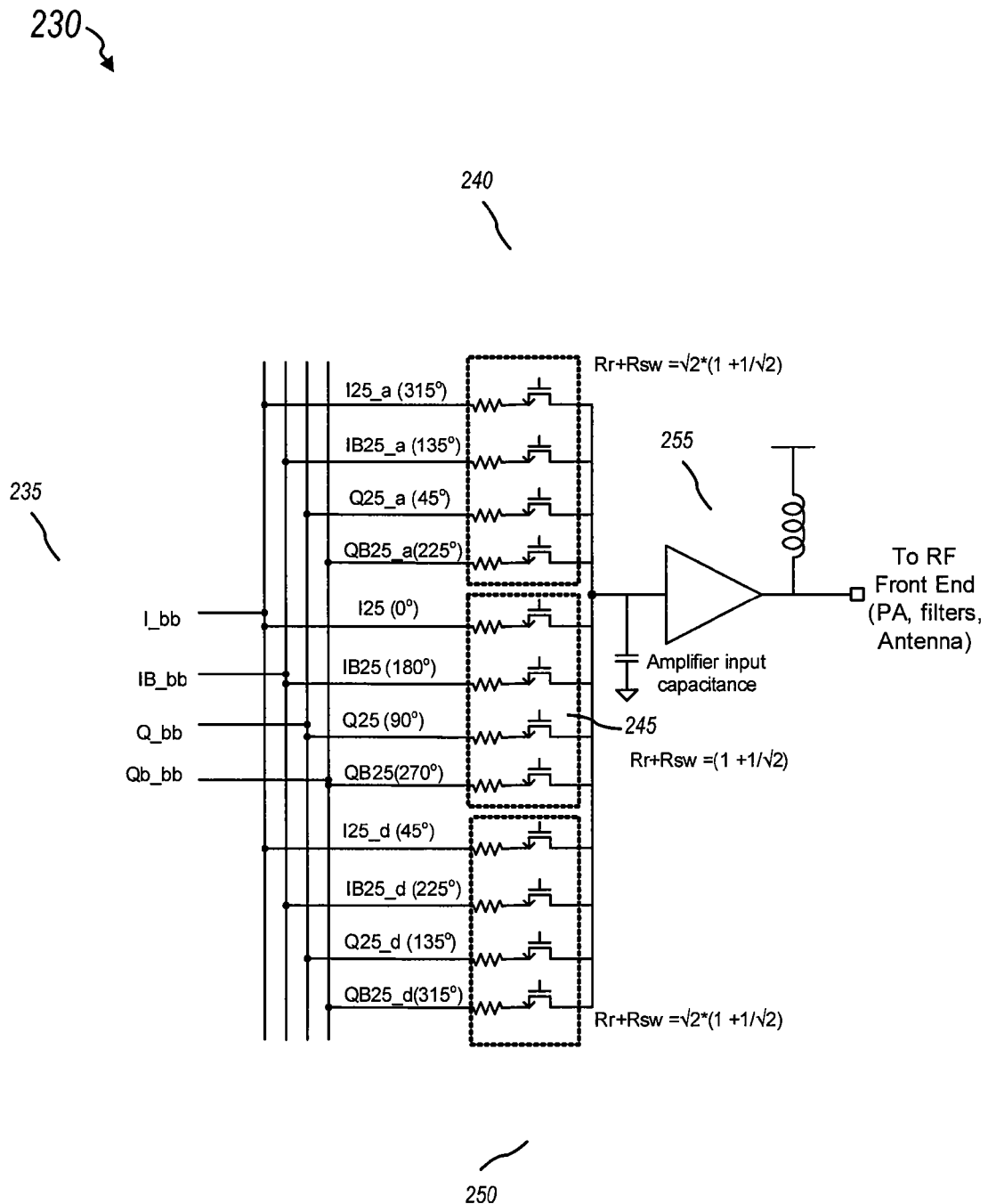

FIGS. 2A, 2B, and 2C illustrate an example concept to show why various embodiments, e.g. FIGS. 1, 3, and 4, achieve harmonic reject upconversion using passive mixers. Referring to FIG. 2A, illustration 200 shows two graphs 205 and 210 that represent an example desired effective local oscillator waveform of the mixers that functionally reduce the spurious mixing products at or near the third and fifth harmonics. Graph 205 represents a waveform for the in-phase (I) component, while graph 210 represents a waveform for the quadrature (Q) component. When the I component of the signal is multiplied by the waveform of graph 205 and the Q component of the signal is multiplied by the waveform of graph 210 and resulting multiplied signals are summed together (or subtracted) to generate an upconverted output signal, the third and fifth harmonic spurious mixing products are effectively minimized or cancelled, achieving the desired effect. While active mixers are known to be able to achieve graphs 205 and 210 as effective local oscillator waveforms, the present disclosures show how to achieve the same using passive mixers, which by definition cannot be modeled as current source outputs as in an active or Gilbert Cell mixer, but instead act like passive switches. Specifically, the principles of voltage division and voltage superposition, as shown in the example circuit schematic of a voltage divider 215, reveal that periodically varying the resistances R1 and R2 through which the baseband signals are connected to the mixer output, may generate a periodic function that matches graphs 205 and 210. Voltage superposition is used by applying the I and Q baseband signals to Vi and Vq, and consequently, the I and Q upconverted signals are summed at the mixer output according to the principal of voltage superposition In this case, a period of LO may be subdivided into 8 regions of phase, corresponding to 8 different signal outcomes.

Referring to FIG. 2B, according to the circuit schematic 230, when the baseband signals 235 are translated by the 8 different LO phases (e.g. 0, 45, 90, 135, 180, 225, 270, and 315 degrees) and scaled by the specified resistances 110 as shown in FIG. 1, the effective LO mixing (commutation) function, multiplying the I channel and Q channel baseband signals, over time resembles graphs 205 and 210 in FIG. 2A. Thus, employing the principles of voltage division and superposition enables passive mixers to achieve harmonic reject upconverter properties. Three passive mixers 240, 245, and 250, each driven by four-phase LO signals phase-shifted at −45, 0 and +45 degrees respectively, can be implemented to generate the waveforms that, when summed, may match graphs 205 and 210. This result may then be fed into amplifier 255 without the need to provide filters between passive mixers 240, 245, and 250 and amplifier 255, or with reduced filtering requirements between passive mixers 240, 245 and 250 and amplifier 255. The descriptions shown in circuit schematic 230 may be consistent with the example implementation of FIG. 1, though other embodiments that employ the concepts of FIGS. 2A and 2B are also possible. For example, FIG. 2B illustrates three single balanced mixers, but double balanced mixers as shown in FIG. 1 could also be used. Various alternative embodiments will be discussed in FIGS. 4A-4F and 5.

Referring to FIG. 2C, chart 260 summarizes how the three passive mixers 240, 245, and 250 (or the three direct quadrature mixers 115 in FIG. 1) change through one period of the LO in order to generate the mixing function waveforms of graphs 205 and 210 that act on I channel and Q channel baseband signals, respectively. As previously mentioned, in some embodiments, one period of the LO is subdivided into 8 subperiods, beginning at 0, 45, 90, 135, 180, 225, 270, and 315 degrees, respectively, which is shown on the left. The three passive mixers 240, 245, and 250 may be viewed as acting like switches, each with four different "on" states corresponding to the four phases of the LO the mixers are driven by. Here, a "1" state in the various columns of chart 260 indicates a particular switch of the mixers is on, while a "0" state indicates that switch is off. Because 25% duty cycle LO signals are used in this embodiment, each switch is ON for two consecutive sub-periods. For example, under the column named "I25_a," at subperiods beginning at 0 degrees and 315 degrees, this particular switch is on, while at all other subperiods, it is off. One should note that the names of the switches shown in chart 260 correspond with the names of the switches in circuit schematic 230 of FIG. 2B. For each of the eight associated subperiods, the operation of the harmonic reject upconverter can be mapped to voltage divider 215 shown in FIG. 2A. For each of the eight sub-periods, the time-varying resistors R1 and R2 can be computed by inspection of FIG. 2B and chart 260 and those values are noted in $14^{th}$ and $15^{th}$ columns of chart 260. Similarly associated time-varying input voltages $V_i$ and $V_q$, for the voltage divider 215 are noted in the $16^{th}$ and $17^{th}$ columns of chart 260. Combining this information together according to the voltage, an output voltage can be computed at each of the 8 subperiods. That is, the output voltage at each of the 8 subperiods would be some linear combination of the I voltage and the Q voltage, based on which switches are on during that subperiod, according to chart 260. The coefficients involved in the linear combination are noted in the last two columns of chart 260. A plot of the value of these coefficients multiplying the I channel and Q channel baseband voltages showing each of the 8 subperiods in order would then generate the effective local oscillator waveforms of graphs 205 and 210.

Figure 3A:
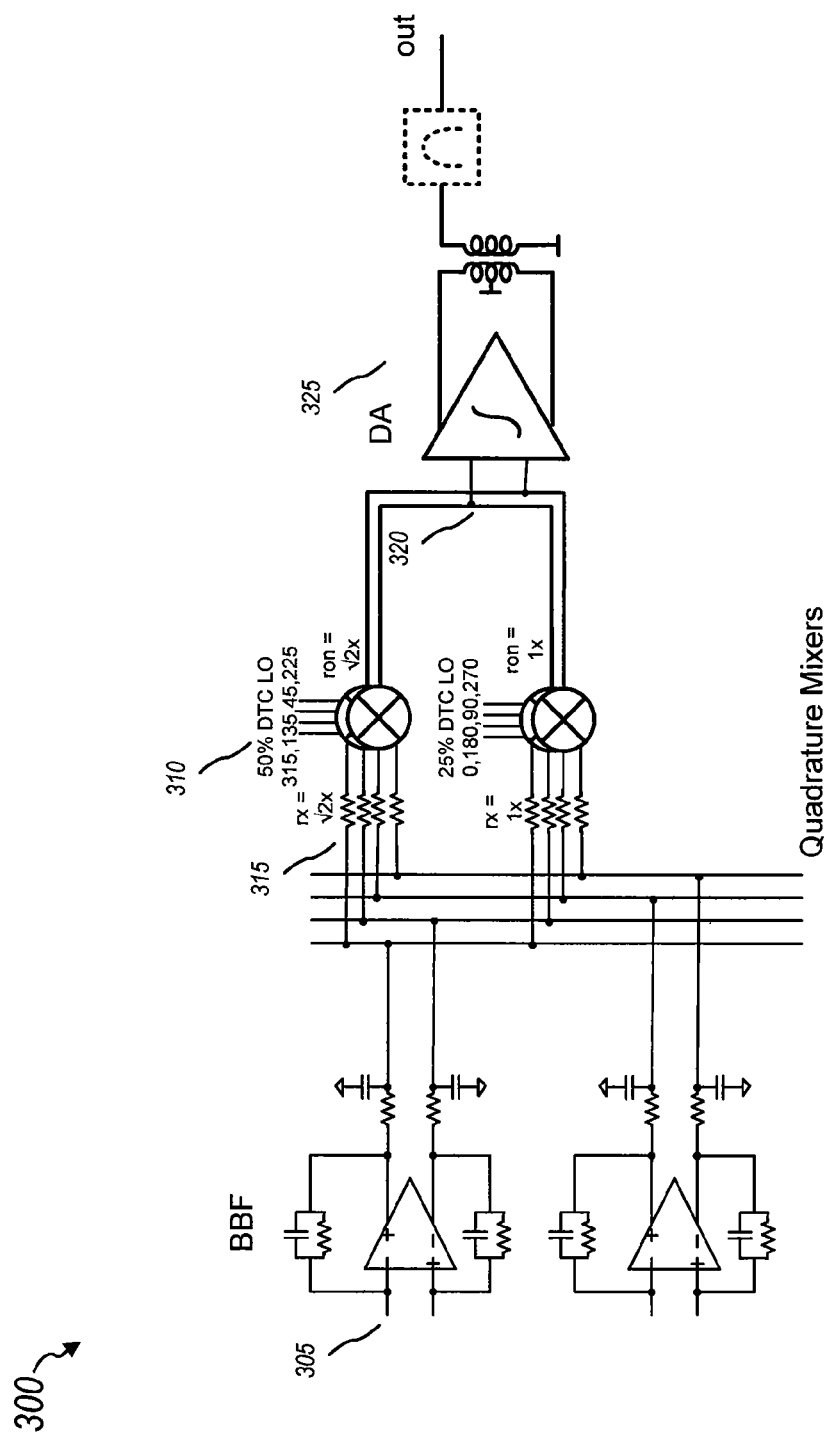

Referring to FIG. 3A, in some embodiments, alternate example implementation 300 may be used to achieve harmonic reject upconversion using passive mixers. Here, two quadrature mixers 310 each with four-phase LO signals receive input baseband signals 305 via scaled resistances 315 as shown. However, in this case, a first mixer with −45 degree shifted phase has 50% duty cycle of the LO, while the second mixer with 0 degree shifted phase has 25% duty cycle of the LO. Similar to the relationship between FIG. 1 and FIG. 2C, FIG. 3B illustrates a chart 350 similar to chart 260 that shows, based on this configuration and the principles of voltage superposition and voltage division, how the mixing function LO waveforms of graphs 205 and 210 are generated using example implementation 300. Then, similar to FIG. 1, the outputs 320 of quadrature mixers 310 may be directly connected and fed as inputs to DA 325 or the like. As before, filters are not needed in between quadrature mixers 310 and DA 325, but some filtering can be used if additional suppression of $3^{rd}$ and $5^{th}$ harmonic signals is desired.

Figure 4A:
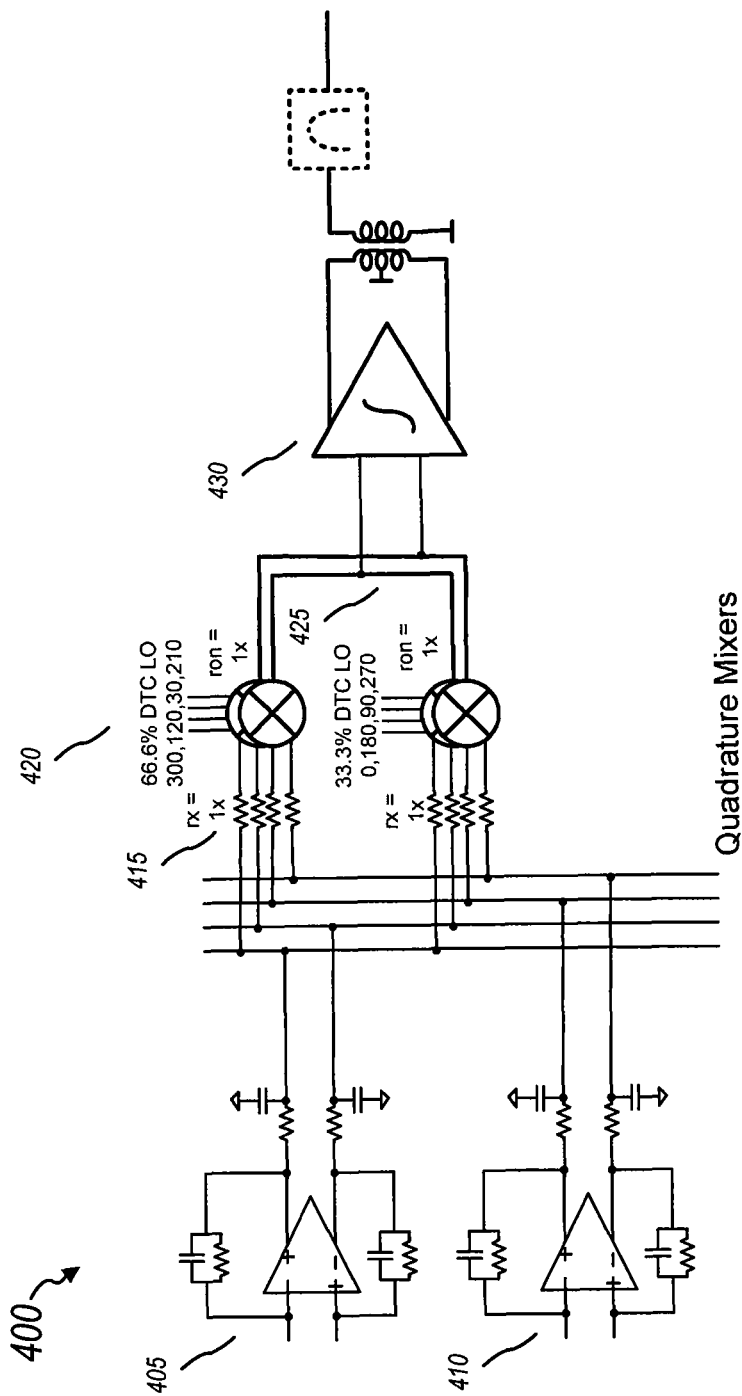
Figure 4B:
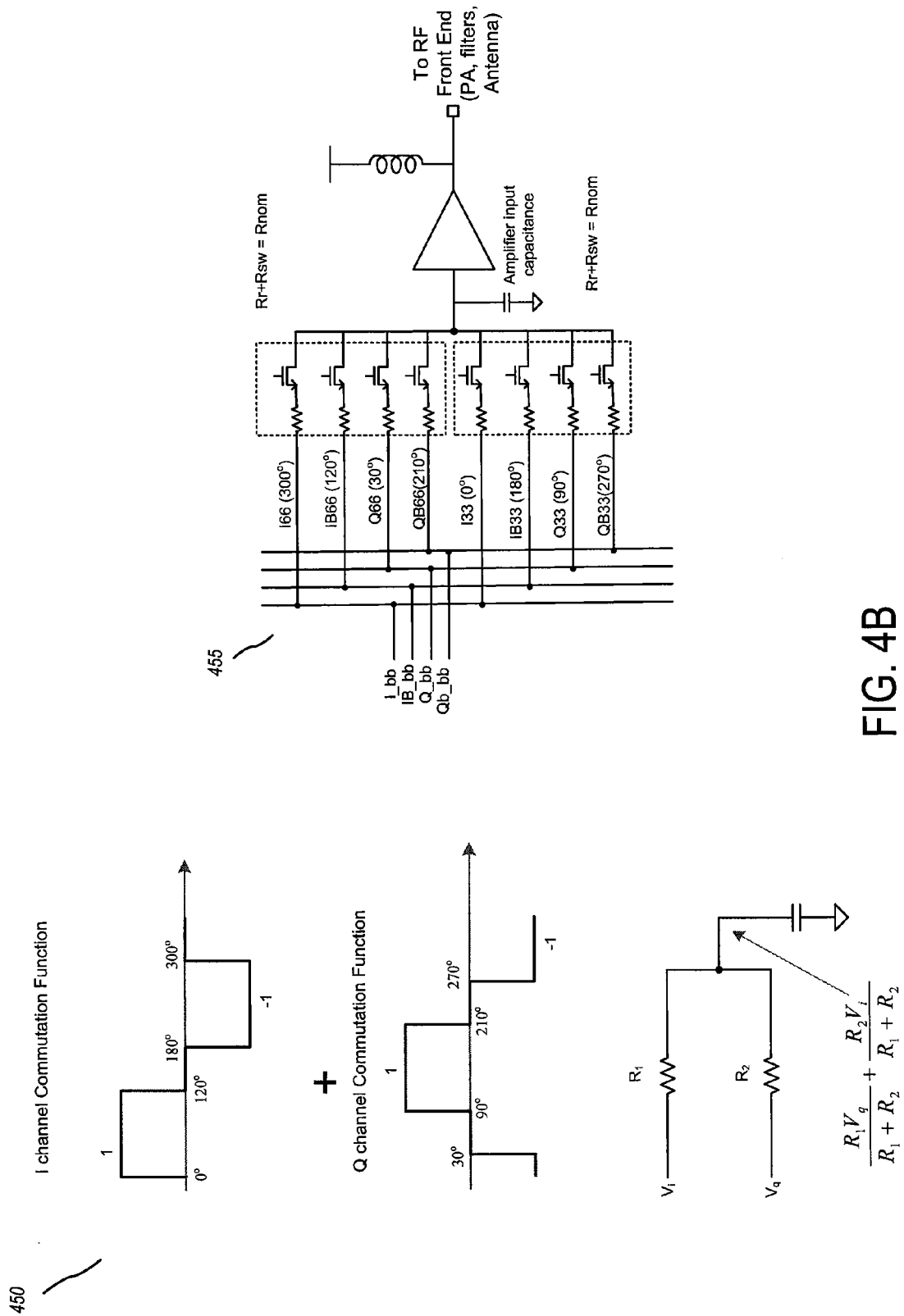

Referring to FIG. 4A, in some embodiments, alternate example implementation 400 may be used to achieve harmonic reject upconversion using passive mixers. Here, two quadrature mixers 420 each with four-phase LO signals receive input baseband signals 405 or 410 via scaled resistances 415 as shown. Additionally, a first mixer with 0 degree shifted phase has 33.3% duty cycle of the LO, while the second mixer with −60 degree shifted phase has 66.6% duty cycle of the LO. Like in FIG. 1, persons having ordinary skill in the art would understand how a chart similar to chart 260 could be constructed to show, based on this configuration and the principles of voltage superposition and voltage division, how the waveforms 450 are generated using alternate implementation 400. This is shown in FIG. 4C. Then, similar to FIG. 1, the outputs 425 of quadrature mixers 420 may be directly connected and fed as inputs to DA 430 or the like. As before, filters are not needed in between quadrature mixers 420 and DA 430. FIG. 4B is another illustration of the alternate embodiment corresponding to FIG. 4A, this time showing the individual transistors similar to FIG. 2B, at schematic 455. The example alternate implementation 400 may generate the resulting effective I and Q local oscillator waveforms as shown in graphs 450, similar to what is discussed in FIG. 2A. As alluded to above, FIG. 4C is a chart 460 similar to chart 260 showing, based on the alternate implementation 400 configuration and the principles of voltage superposition and voltage division, how the waveforms of graph 450 are generated using alternate implementation 400. In alternate implementation 400, the spurious mixing products near the third harmonic signals (3*LO−BB or 3*LO+BB, "third harmonic spurious mixing product") 140 are cancelled or suppressed while the spurious mixing products near the fifth harmonic signals (5*LO+BB or 5*LO−BB, "fifth harmonic spurious mixing product") 145 are not cancelled or suppressed.

Figure 4D:
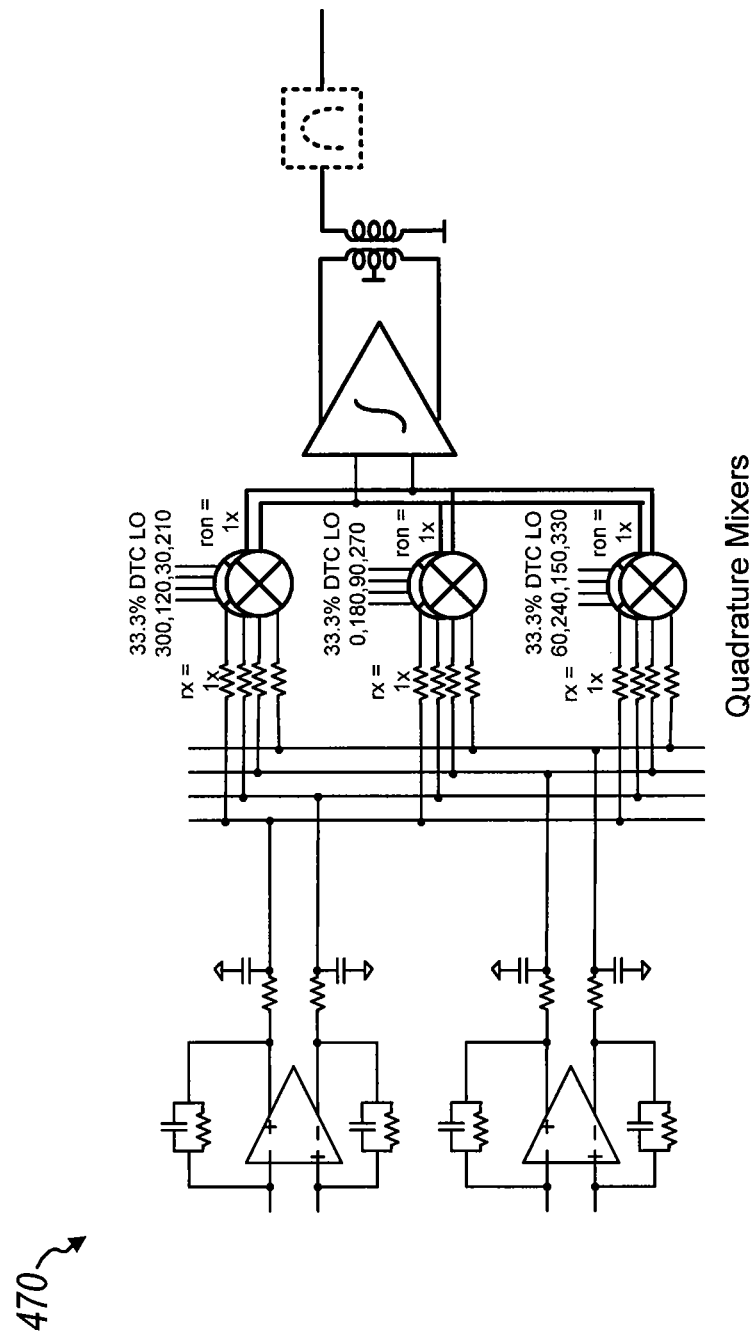
Figure 4E:
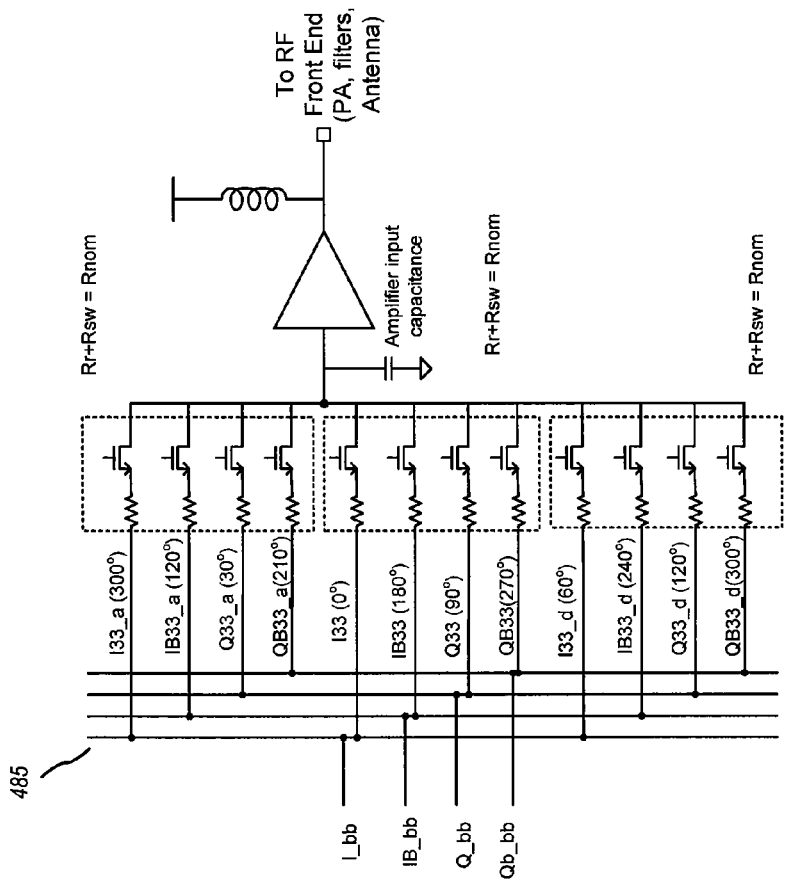
Figure 4E:
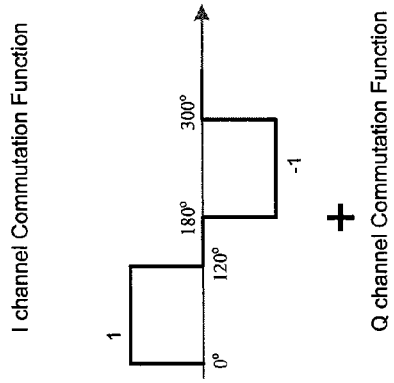
Figure 4E:
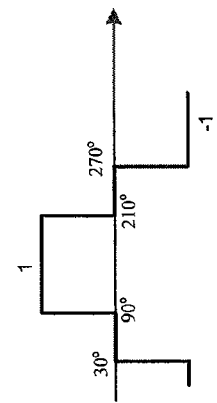
Figure 4E:
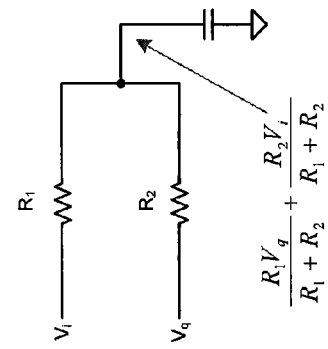

FIGS. 4D, 4E and 4F are the corresponding diagrams for another alternate embodiment 470 that also uses 33.3% duty cycle LO signals and three mixers to achieve a similar passive harmonic rejection upconverter similar to alternate implementation 400. FIG. 4E shows illustrations 480 and 485 similar to those in FIG. 4B (and FIGS. 2A and 2B), but corresponding to FIG. 4D, while FIG. 4F shows chart 490 similar to chart 470 (and chart 260), but corresponding to FIG. 4D. Based on these examples, one of skill in the art would understand how to extend the passive harmonic rejection upconverter to other duty cycles besides 25% and 33%.

Figure 5:
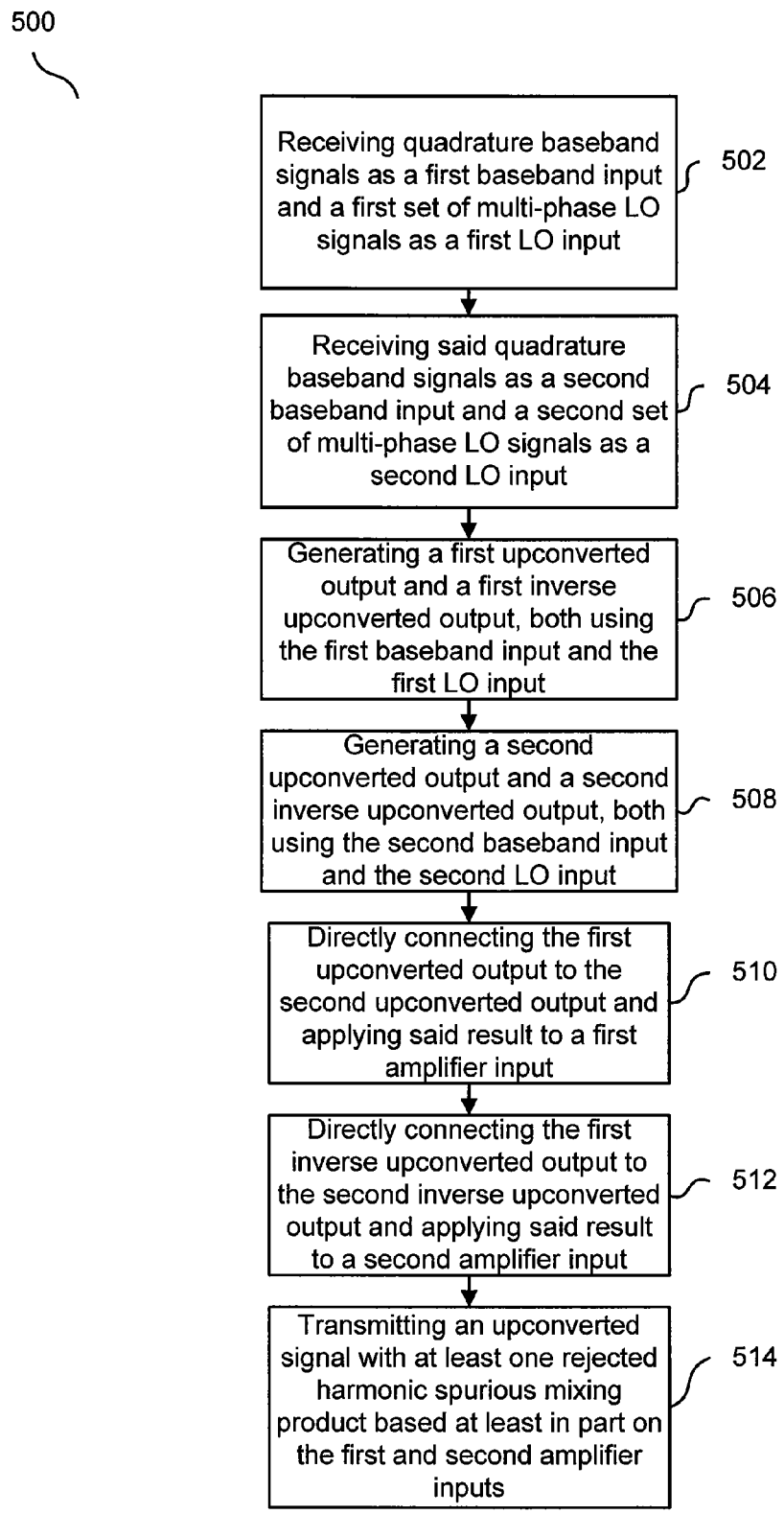
FIG. 5 is a flowchart describing a harmonic rejection operation according to an embodiment.

Referring to FIG. 5, an example method flowchart 500 for harmonic reject upconverting a baseband signal using at least one passive mixer according to some embodiments, is presented. At block 502, the method may include receiving quadrature baseband signals as a first baseband input and a first set of multi-phase LO signals as a first LO input. In some embodiments, the baseband signals include four signals, e.g. Ibb, IBBbb, Qbb, and QBbb. In some embodiments, the multi-phase LO signals are four-phase LO signals. Certainly, other configurations are possible that remain consistent with performing harmonic reject upconversion according to the principles of voltage superposition and voltage division. In some embodiments, the quadrature baseband signals and the multi-phase LO signals are received at a quadrature passive mixer.

At block 504, the method may include receiving said quadrature baseband signals as a second baseband input and a second set of multi-phase LO signals as a second LO input. Like block 502, in some embodiments, the multi-phase LO signals may include four-phase signals. In some embodiments, the second set of multi-phase LO signals may be phase-shifted relative to the first set of multi-phase LO signals. For example, the second set of multi-phase LO signals may be shifted +/−45 degrees, or +/−90 degrees from the first set of multi-phase LO signals. Other configurations are also possible. In some embodiments, the quadrature baseband signals and the multi-phase LO signals are received at a quadrature passive mixer. In some embodiments, the LO signals received at quadrature passive mixers may be 25% duty cycle, 33% duty cycle, or 50% duty cycle, or substantially some variant thereof.

At block 506, the method may include generating a first upconverted output and its inverse upconverted output, both the first upconverted output and first inverse upconverted output using the first baseband input and the first LO input. In some embodiments, these two outputs may be generated by the passive mixer that received the first baseband input and first LO input. In some embodiments, the first baseband input may be scaled by a resistance. In some embodiments, this resistance may have a relative factor of sqrt(2), 1/sqrt(2), or 1. Other relative factors of resistances are possible that remain consistent with performing harmonic reject upconversion according to the principles of voltage superposition and voltage division.

At block 508, the method may include generating second upconverted output and its inverse upconverted output, both the second upconverted output and second inverse upconverted output using the second baseband input and the second LO input. In some embodiments, these two outputs may be generated by the passive mixer that received the second baseband input and second LO input. In some embodiments, the second baseband input may be scaled by a resistance. In some embodiments, this resistance may have a relative factor of sqrt(2), 1/sqrt(2), or 1. Other resistances are certainly possible.

At block 510, the method may include directly connecting the first upconverted output to the second upconverted output and applying this result to a first amplifier input. The term "directly" may mean that no intervening hardware components (e.g. filters or amplifiers) may be present between the connection of the first upconverted output and the second upconverted output. Similarly, at block 512, the method may include directly connecting the first inverse upconverted output to the second inverse upconverted output and applying this result to a second amplifier input.

At block 514, the method may include transmitting an upconverted signal with at least one rejected spurious harmonic mixing product based at least in part on the first and second amplifier inputs. In some embodiments, the at least one rejected spurious harmonic mixing product includes the third harmonic spurious mixing product. In some embodiments, the at least one rejected spurious harmonic mixing product includes the fifth harmonic spurious mixing product. In some embodiments, both the third harmonic spurious mixing product and the fifth harmonic spurious mixing product rejection may be included. In some embodiments, a transmitter may transmit the upconverted signal, where the transmitter receives an input from the amplifier that received the first and second amplifier inputs.

The steps discussed in FIG. 5 may be consistent with the example implementations discussed in FIGS. 1, 3A, and 4A, and 4D. Also, FIG. 5 may be consistent with the conceptual rationale for performing harmonic reject upconversion as discussed in FIGS. 2A, 2B, 2C, 3B, 4B, 4C, 4E, and 4F.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Various examples have been described. These and other examples are within the scope of the following claims.

What is claimed is:

1. An apparatus for harmonic reject upconverting a baseband signal using at least one quadrature passive mixer, the apparatus comprising:
   a first quadrature passive mixer configured to receive quadrature baseband signals as a first baseband input and a first set of multi-phase local oscillator (LO) signals as a first LO input;
   a second quadrature passive mixer configured to receive said quadrature baseband signals as a second baseband input and a second set of multi-phase LO signals as a second LO input;
   an amplifier comprising a first amplifier input, a second amplifier input, and an amplifier output; and
   a transmitter comprising a transmitter output; wherein:
   said first and second quadrature passive mixers both comprise first and second outputs;
   said first output of said first quadrature passive mixer is directly connected to said first output of said second quadrature passive mixer and together is coupled to said first amplifier input;
   said second output of said first quadrature passive mixer is directly connected to said second output of said second quadrature passive mixer and together is coupled to said second amplifier input; and
   said amplifier output is coupled to said transmitter output, said transmitter output is configured to output an upconverted signal with at least one rejected harmonic spurious mixing product based at least in part on the first and second amplifier inputs.

2. The apparatus of claim 1 wherein said first set of multi-phase LO signals comprises a first set of four-phase LO signals, and wherein said second set of multi-phase LO signals comprises a second set of four-phase LO signals.

3. The apparatus of claim 2 wherein said first set of four-phase LO signals are 25% duty cycle and said second set of four-phase LO signals are 50% duty cycle.

4. The apparatus of claim 3 wherein said first set of four-phase LO signals are shifted by 45 degrees relative to said second set of four-phase LO signals.

5. The apparatus of claim 4 wherein both the first and second quadrature passive mixers comprise at least four transistors, each transistor having a series resistor.

6. The apparatus of claim 4 wherein both the first and second quadrature passive mixers comprise at least eight transistors arranged as a double balanced mixer, each pair of transistors in said double balanced mixer arrangement having a series resistor.

7. The apparatus of claim 5 wherein the series resistors are scaled by a relative factor of 1 for said first quadrature passive mixer and by a relative factor of sqrt(2) for said second passive mixer.

8. The apparatus of claim 7 wherein mixer transistor on resistance associated with both of the quadrature passive mixers is scaled by a same ratio as the series resistors associated with both of the passive mixers.

9. The apparatus of claim 2 further comprising a third quadrature passive mixer configured to receive quadrature baseband signals as a third baseband input and a third set of four-phase LO signals as a third LO input, wherein each of the first, second, and third passive mixers receive 25% duty cycle LO signals.

10. The apparatus of claim 9 wherein said first set of four-phase LO signals are shifted by 45 degrees relative to said second set of four-phase LO signals and said first set of four-phase LO signals are shifted −45 degrees relative to said third set of four-phase LO signals.

11. The apparatus of claim 10 wherein each of the first, second, and third passive mixer comprises at least four transistors, each transistor having a series resistor.

12. The apparatus of claim 10 wherein both the first and second quadrature passive mixers comprise at least eight transistors arranged as a double balanced mixer, each pair of transistors in said double balanced mixer arrangement having a series resistor.

13. The apparatus of claim 11 wherein the series resistors are scaled by a relative factor of 1 for said first passive mixer, by a relative factor of sqrt(2) for said second passive mixer, and by a relative factor of sqrt(2) for said third passive mixer.

14. The apparatus of claim 13 wherein mixer transistor on resistance is scaled by the same ratio as the series resistors associated with the at least four transistors.

15. The apparatus of claim 2 wherein said first set of four-phase LO signals are 33% duty cycle and said second set of four-phase LO signals are 66% duty cycle.

16. The apparatus of claim 1 wherein the first output of said first quadrature passive mixer is directly connected to said first output of said second quadrature passive mixer based on principles of voltage division and voltage superposition.

17. The apparatus of claim 2 further comprising a third quadrature passive mixer, wherein each of the first, second, and third passive mixers receive 33% duty cycle LO signals.

18. A method for harmonic reject upconverting a baseband signal using at least one quadrature passive mixer, the method comprising:
   receiving quadrature baseband signals as a first baseband input and a first set of multi-phase local oscillator (LO) signals as a first LO input;
   receiving said quadrature baseband signals as a second baseband input and a second set of multi-phase LO signals as a second LO input;
   generating a first upconverted output and a first inverse upconverted output, both using the first baseband input and the first LO input;
   generating a second upconverted output and a second inverse upconverted output, both using the second baseband input and the second LO input;
   directly connecting the first upconverted output to the second upconverted output and applying said result to a first amplifier input;

directly connecting the first inverse upconverted output to the second inverse upconverted output and applying said result to a second amplifier input; and transmitting an upconverted signal with at least one rejected harmonic spurious mixing product based at least in part on the first and second amplifier inputs.

19. The method of claim 18 wherein said first set of multi-phase LO signals comprises a first set of four-phase LO signals, and wherein said second set of multi-phase LO signals comprises a second set of four-phase LO signals.

20. The method of claim 19 wherein said first set of four-phase LO signals are 25% duty cycle and said second set of four-phase LO signals are 50% duty cycle.

21. The method of claim 20 wherein said first set of four-phase LO signals are shifted by 45 degrees relative to said second set of four-phase LO signals.

22. The method of claim 21 further comprising:
scaling said first baseband input by a relative factor of 1; and
scaling said second baseband input by a relative factor of sqrt(2).

23. The method of claim 22 wherein the first upconverted output and the first inverse upconverted output have a scaled resistance factor of 1, and wherein the second upconverted output and the second inverse upconverted output have a scaled resistance factor of sqrt(2).

24. The method of claim 19 further comprising receiving said quadrature baseband signals as a third baseband input and a third set of four-phase LO signals as a third LO input, wherein each of the first, second, and third four-phase LO signals are 25% duty cycle.

25. The method of claim 24 wherein said first set of four-phase LO signals are shifted by 45 degrees relative to said second set of four-phase LO signals and said first set of four-phase LO signals are shifted −45 degrees relative to said third set of four-phase LO signals.

26. The method of claim 25 further comprising:
scaling said first baseband input by a relative factor of 1;
scaling said second baseband input by a relative factor of sqrt(2); and
scaling said third baseband input by a relative factor of sqrt(2).

27. The method of claim 26 further comprising:
generating a third upconverted output and a third inverse upconverted output, both using the third baseband input and the third LO input;
directly connecting the third upconverted output to the first upconverted output and the second upconverted output and applying said result to the first amplifier input; and
directly connecting the third inverse upconverted output to the first inverse upconverted output and the second inverse upconverted output and applying said result to a third second amplifier input.

28. The method of claim 27 wherein the first upconverted output and the first inverse upconverted output have a scaled resistance factor of 1, the second upconverted output and the second inverse upconverted output have a scaled resistance factor of sqrt(2), and the third upconverted output and the third inverse upconverted output have a scaled resistance factor of sqrt(2).

29. The method of claim 19 wherein said first set of four-phase LO signals are 33% duty cycle and said second set of four-phase LO signals are 66% duty cycle.

30. The method of claim 19 further comprising receiving said quadrature baseband signals as a third baseband input and a third set of four-phase LO signals as a third LO input, wherein each of the first, second, and third four-phase LO signals are 33% duty cycle.

31. The method of claim 18 wherein directly connecting the first upconverted output to the second upconverted output and directly connecting the first inverse upconverted output to the second inverse upconverted output are based on principles of voltage division and voltage superposition.

32. An apparatus for harmonic reject upconverting a baseband signal, the apparatus comprising:
means for receiving quadrature baseband signals as a first baseband input and a first set of multi-phase local oscillator (LO) signals as a first LO input;
means for receiving said quadrature baseband signals as a second baseband input and a second set of multi-phase LO signals as a second LO input;
means for generating a first upconverted output and a first inverse upconverted output, both using the first baseband input and the first LO input;
means for generating a second upconverted output and a second inverse upconverted output, both using the second baseband input and the second LO input;
means for directly connecting the first upconverted output to the second upconverted output and applying said result to a first amplifier input;
means for directly connecting the first inverse upconverted output to the second inverse upconverted output and applying said result to a second amplifier input; and
means for transmitting an upconverted signal with at least one rejected harmonic spurious mixing product based at least in part on the first and second amplifier inputs.

33. The apparatus of claim 32 wherein said first set of multi-phase LO signals comprises a first set of four-phase LO signals, and wherein said second set of multi-phase LO signals comprises a second set of four-phase LO signals.

34. The apparatus of claim 33 wherein said first set of four-phase LO signals are 25% duty cycle and said second set of four-phase LO signals are 50% duty cycle.

35. The apparatus of claim 34 wherein said first set of four-phase LO signals are shifted by 45 degrees relative to said second set of four-phase LO signals.

36. The apparatus of claim 35 further comprising:
means for scaling said first baseband input by a relative factor of 1; and
means for scaling said second baseband input by a relative factor of sqrt(2).

37. The apparatus of claim 36 wherein the first upconverted output and the first inverse upconverted output have a scaled resistance factor of 1, and wherein the second upconverted output and the second inverse upconverted output have a scaled resistance factor of sqrt(2).

38. The apparatus of claim 33 further comprising means for receiving said quadrature baseband signals as a third baseband input and a third set of four-phase LO signals as a third LO input, wherein each of the first, second, and third four-phase LO signals are 25% duty cycle.

39. The apparatus of claim 38 wherein said first set of four-phase LO signals are shifted by 45 degrees relative to said second set of four-phase LO signals and said first set of four-phase LO signals are shifted −45 degrees relative to said third set of four-phase LO signals.

40. The apparatus of claim 39 further comprising:
means for scaling said first baseband input by a relative factor of 1;
means for scaling said second baseband input by a relative factor of sqrt(2); and means for scaling said third baseband input by a relative factor of sqrt(2).

41. The apparatus of claim 40 further comprising:

means for generating a third upconverted output and a third inverse upconverted output, both using the third baseband input and the third LO input;

means for directly connecting the third upconverted output to the first upconverted output and the second upconverted output and applying said result to the first amplifier input; and means for directly connecting the third inverse upconverted output to the first inverse upconverted output and the second inverse upconverted output and applying said result to third second amplifier input.

42. The apparatus of claim 41 wherein the first upconverted output and the first inverse upconverted output have a scaled resistance factor of 1, the second upconverted output and the second inverse upconverted output have a scaled resistance factor of sqrt(2), and the third upconverted output and the third inverse upconverted output have a scaled resistance factor of sqrt(2).

43. The apparatus of claim 33 wherein said first set of four-phase LO signals are 33% duty cycle and said second set of four-phase LO signals are 66% duty cycle.

44. The apparatus of claim 33 further comprising means for receiving said quadrature baseband signals as a third baseband input and a third set of four-phase LO signals as a third LO input, wherein each of the first, second, and third four-phase LO signals are 33% duty cycle.

45. The apparatus of claim 32 wherein directly connecting the first upconverted output to the second upconverted output and directly connecting the first inverse upconverted output to the second inverse upconverted output are based on principles of voltage division and voltage superposition.

* * * * *